United States Patent
Kinugawa

[11] Patent Number: 5,963,842
[45] Date of Patent: *Oct. 5, 1999

[54] SATELLITE BROADCASTING RECEIVING TUNER

[75] Inventor: Toshimitsu Kinugawa, Fukushima-ken, Japan

[73] Assignee: Alps Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/758,133

[22] Filed: Nov. 25, 1996

[30] Foreign Application Priority Data

Dec. 4, 1995 [JP] Japan .................................. 7-315314

[51] Int. Cl.$^6$ .................................................. H04N 5/50
[52] U.S. Cl. .................... 455/3.2; 455/191.1; 455/302; 455/339; 455/340; 348/731; 333/176; 334/15
[58] Field of Search .............................. 348/731; 455/3.2, 455/190.1, 302, 307, 339, 340, 286, 197.1, 266, 101.1; 333/174, 176; 334/15

[56] References Cited

U.S. PATENT DOCUMENTS

| | | | |
|---|---|---|---|
| 2,308,258 | 1/1943 | Armstrong et al. | 455/339 |
| 4,601,062 | 7/1986 | Hettinger | 455/307 |
| 4,614,925 | 9/1986 | Kane | 333/174 |
| 4,663,694 | 5/1987 | Sakamoto | 361/305 |
| 4,696,055 | 9/1987 | Marshall | 45/302 |
| 4,835,608 | 5/1989 | Lachiw et al. | 455/340 |
| 4,905,306 | 2/1990 | Anderson | 455/340 |
| 4,996,482 | 2/1991 | Fujito | 324/318 |
| 5,021,757 | 6/1991 | Kobayashi | 333/205 |
| 5,060,297 | 10/1991 | Ma et al. | 455/302 |
| 5,121,078 | 6/1992 | Havot et al. | 333/176 |
| 5,222,106 | 6/1993 | Satoh et al. | 455/340 |
| 5,276,398 | 1/1994 | Withers et al. | 324/318 |
| 5,377,272 | 12/1994 | Albean | 381/13 |
| 5,428,828 | 6/1995 | Pugel et al. | 455/180.4 |
| 5,493,261 | 2/1996 | Kitoh et al. | 333/206 |
| 5,577,270 | 11/1996 | Sakai | 455/307 |
| 5,715,531 | 2/1998 | Liu | 455/3.2 |

FOREIGN PATENT DOCUMENTS 61-87408  2/1986  Japan .

*Primary Examiner*—Andrew I. Faile
*Assistant Examiner*—Reuben M. Brown
*Attorney, Agent, or Firm*—Brinks Hofer Gilson & Lione

[57] ABSTRACT

A satellite broadcasting receiving tuner having a band-pass filter capable of adequately attenuating and removing disturbing wave components having frequencies in the vicinity of 480 MHz and capable of being easily tuned to the high-end frequency. The tuner has at least the band-pass filter for transmitting a down-converted received satellite broadcasting signal and a frequency converter section for converting the received satellite broadcasting signal transmitted through the band-pass filter into a signal having an intermediate frequency. The band-pass filter has a first variable tuning circuit formed of two inductors connected in series and a variable capacitance element branching off from this series connection, a second variable tuning circuit also formed of two inductors connected in series and a variable capacitance element branching off from this series connection, and a trap element connected to a point of connection of the first and second variable tuning circuits to effect selective attenuation at the intermediate frequency. The trap element is a chip capacitor and inductors are strip lines.

4 Claims, 6 Drawing Sheets

SATELLITE BROADCASTING RECEIVING TUNER

BACKGROUND OF THE INVENTION

1. Field of the Invention

The present invention relates generally to satellite broadcasting receiving tuners (broadcasting satellite tuners) and, more particularly, to a satellite broadcasting receiving tuner provided with a means for preventing a received UHF signal from leaking out of the satellite broadcasting receiving tuner simultaneously with the output of a down-converted received satellite broadcasting signal.

2. Description of the Related Art

Conventionally, a signal receiving system such as that shown in FIG. 4 is used for the purpose of receiving two broadcast waves of ground wave broadcasting in the VHF and UHF bands and satellite broadcasting by different antennas and inputting the received waves to a television set.

Referring to FIG. 4, the signal receiving system has an antenna 31 for receiving ground wave broadcasts in the VHF and UHF bands (hereinafter referred to as "UV antenna") and a satellite broadcasting receiving antenna 32 (hereinafter referred to as "BS antenna"), which are installed outside a house, a booster 33 also installed outside the house (hereinafter referred to as "UV/BS booster"), a distributor 35 installed inside the house, a first coaxial cable 34 which connects an output terminal of the UV/BS booster 33 and an input terminal of the distributor 35, a second coaxial cable 36 which connects one of two output terminals of the distributor 35 and an antenna outlet 37, a third coaxial cable 38 which connects the other output terminal of the distributor 35 and another antenna outlet 39, and a UV/BS separator 40.

A ground wave broadcasting signal received by the UV antenna 31 (hereinafter referred to as "UV signal") and a satellite broadcasting signal received by the BS antenna 32 and frequency-converted by the down converter (LNB) 32a (hereinafter referred to as "BS signal") are respectively input to the UV/BS booster 33. The UV/BS booster 33 amplifies and mixes the input UV and BS signals to obtain a UV/BS signal, and outputs the UV/BS signal to the coaxial cable 34. The coaxial cable 34 leads the UV/BS signal from the exterior to the interior of the house to supply the signal to the distributor 35. The distributor 35 distributes the input UV/BS signal to the two output terminals. The UV/BS signal obtained at one of the two output terminals is supplied to the antenna outlet 37 through the coaxial cable 6 and is supplied from the antenna outlet 37 to the UV/BS separator 40. The UV/BS separator 40 separates the supplied UV/BS signal into UV and BS signals and separately outputs these signals. The UV signal is supplied to a UV receiving terminal of a television set 41 while the BS signal is supplied to a BS receiving terminal of the television set 41. The television set 41 has a UV tuner connected to the UV receiving terminal and a BS tuner connected to the BS receiving terminal. The UV tuner converts the input UV signal into an intermediate frequency signal (IF signal) and outputs the converted signal. The BS tuner also converts the input BS signal into an intermediate frequency signal (IF signal) and outputs the converted signal.

FIG. 5 is a block diagram showing the configuration of an example of the known BS tuner in the above-described system.

Referring to FIG. 5, a BS tuner 42 has an input terminal 43, a high-frequency amplifier (RF amplifier) section 44, a variable band-pass filter (BPF) 45, a mixer section 46, a local oscillator section 47, a first intermediate frequency amplifier (IF amplifier) section 48, a surface acoustic wave (SAW) filter 49, a second intermediate frequency amplifier (IF amplifier) section 50, and an output terminal 51. The input terminal 43 is connected to the BS receiving terminal of the television set 41.

The BS signal supplied to the input terminal 43 is amplified in the high-frequency amplifier section 44, and unnecessary frequency components in the BS signal are removed by the variable band-pass filter 45. Next, in the mixer section 46, the BS signal is frequency-mixed with a local oscillation signal supplied from the local oscillation section 46. An intermediate frequency signal in the frequency-mixed signal is amplified in the first intermediate frequency amplifier section 48. Subsequently, unnecessary frequency components of the intermediate frequency signal are removed by the surface acoustic wave filter 49, and the intermediate frequency signal is again amplified in the second intermediate frequency amplifier section 50 before being supplied to a subsequent circuit (demodulation circuit) through the output terminal 51.

FIG. 6A is a circuit diagram showing the configuration of an example of the variable band-pass filter 45 used in the BS tuner 42, and FIG. 6B is a diagram showing an equivalent circuit in a frequency range lower than the band-pass frequency of the variable band-pass filter 45. FIG. 7 is a diagram showing an example of frequency transmission characteristics of the variable band-pass filter 45.

As shown in FIG. 6A, the variable band-pass filter 45 has four strip lines 52 to 55 connected in series between an input terminal 45(I) and an output terminal 45(O), a strip line 56 connected as a branch line between a point of connection of the strip lines 53 and 54 and a ground point, a capacitor 57 and a variable capacitance diode 58 connected in series between a point of connection of the strip lines 52 and 53 and a ground point, a capacitor 59 and a variable capacitance diode 60 connected in series between a point of connection of the strip lines 54 and 55 and a buffer resistor 62 connected between a point of connection of the capacitor 57 and the variable capacitance diode 58 and a tuning control voltage supply terminal 61, a buffer resistor 63 connected between a point of connection of the capacitor 59 and the variable capacitance diode 60 and the tuning control voltage supply terminal 61.

A predetermined tuning control voltage is supplied to the tuning control voltage supply terminal 61 to apply bias voltages to the variable capacitance diodes 58 and 60. The capacitances of the variable capacitance diodes 58 and 60 are changed by the bias voltages to tune the variable band-pass filter 45 so that the band-pass frequency of the filter coincides with a predetermined frequency in the range from 1 to 2 GHz (1000 to 2000 MHz), i.e., the frequency of the input BS signal. At this time, the BS signal supplied to the input terminal 45(I) passes the variable band-pass filter 45 while unnecessary components thereof are removed. The BS signal is thereafter supplied from the output terminal 45(O) to the subsequent circuit.

For example, in the case of a European broadcasting system, a BS wave in the 12 GHz band may be received by the BS antenna 32 and is converted into a BS signal in the band from 1 to 2 GHz by the down converter 32a provided in the vicinity of the BS antenna 32. The BS signal is supplied to the BS receiving terminal of the television set 41 via the UV/BS booster 33, the distributor 35 and the UV/BS separator 40. Next, in the television set 41, the BS signal applied to the BS receiving terminal is supplied to the BS tuner 42 to undergo high-frequency amplification, frequency conversion and intermediate frequency amplification. Thereafter, the BS signal is supplied as an intermediate frequency signal from the BS tuner 42 to the subsequent circuit.

The UV/BS signal supplied to the UV/BS separator 40 in this receiving is separated into UV and BS signals by the UV/BS separator 40. Ordinarily, the BS signal output from the UV/BS separator 40 to the BS receiving terminal of the television set 41 contains a UV signal component at a comparatively high level because the signal separating ability of the UV/BS separator 40 is not sufficiently high.

Assuming that the frequency band of the BS signal input to the BS tuner 42 is from 1 to 2 GHz (1000 to 2000 MHz) as mentioned above and that the frequency band of the intermediate frequency of the BS tuner 42 is 480 MHz, a television broadcasting wave having a frequency of 480 MHz in television broadcasting waves in the UHF band having frequencies of 470 to 480 MHz coincides with the 480 MHz intermediate frequency signal of the BS tuner 42.

It the BS signal output from the UV/BS separator 40 is applied to the BS receiving terminal of the television set 41 with the 480 MHz television broadcasting wave contained therein and is then supplied to the BS tuner 42, then the 480 MHz television broadcasting wave is first amplified in the high-frequency amplifier section 44 of the BS tuner 42 and is then supplied to the variable band-pass filter 45.

At this time, since in the known variable band-pass filter 45 the 480 MHz television broadcasting wave (disturbing wave) corresponds to the non-transmission range (band-stop range) of the variable band-pass filter 45, it is essentially necessary that the disturbing wave component having a frequency of 480 MHz be sufficiently attenuated and removed by the variable band-pass filter 45 so as not to be transmitted to the output terminal of the variable band-pass filter 45 and to the output terminal 51 of the BS tuner 42. However, residual disturbing wave components having a frequency of 480 MHz are output through the output terminal 51 of the BS tuner 42 for various reasons described below.

First, in the variable band-pass filter 45, the reactance of the variable capacitance diodes 58 and 60 becomes large in a frequency range lower than the band-pass frequency. With respect to frequencies in the vicinity of 500 MHz, each of the variable capacitance diodes 58 and 60 is regarded as being in a substantially open condition such that an equivalent circuit shown in FIG. 6B is formed. The characteristics of the variable band-pass filter 45 are such that, as shown in FIG. 7, an attenuation in the variable band-pass filter 45 at a frequency in the vicinity of 480 MHz is about 16 db when the band-pass filter 45 is tuned to 1 GHz (1000 MHz), and that, even when the variable band-pass filter 45 is tuned to 2 GHz (2000 MHz), an attenuation in the variable band-pass filter 45 at a frequency in the vicinity of 480 MHz is only slightly larger than 16 db. Therefore, the 480 MHz television broadcasting wave is not sufficiently attenuated by the variable band-pass filter 45, so that part of the 480 MHz television broadcasting wave is output from the variable band-pass filter 45. Second, when the 480 MHz television broadcasting wave is amplified by the high-frequency amplifier section 44, part of the 480 MHz television broadcasting wave is converted into a disturbing wave component having a frequency of about 1 GHz (1000 MHz) by secondary distortion in the high-frequency amplifier section 44. This disturbing wave component passes the variable band-pass filter 45 to be contained in the output from this filter. Third, a disturbing wave component having a frequency in the vicinity of 480 MHz is generated in the mixer section 46. This disturbing wave component is not completely removed by amplification in the first intermediate frequency amplifier section 48 and in the second intermediate frequency amplifier section 50. Also, this disturbing wave component cannot be completely removed by the surface acoustic wave filter 49. As a result, this component is supplied to the output terminal 51. In these disturbing wave components, the amplitude of the disturbing wave with the first reason is largest while the amplitude of the disturbing wave with the third reason is smallest.

The known variable band-pass filter 45 has a drawback described below. Because stray capacitances Cs (e.g., about 0.5 pF) of the buffer resistors 62 and 63 for supplying the tuning control voltage to the variable capacitance diodes 58 and 60 are connected in parallel with the capacitances of the variable capacitance diodes 58 and 60, it is difficult to tune the variable band-pass filter 45 to the high-end frequency of 2 GHz (2000 MHz) of the BS signal. As shown in FIG. 7, the minimum value of the frequency attenuation characteristic of the variable band-pass filter 45 is at a frequency slightly lower than 2 GHz when the variable band-pass filter 45 is controlled for tuning to the high-end frequency of 2 GHz.

As described above, disturbing wave components having frequencies in the vicinity of 480 MHz cannot be completely removed from the output from the band-pass filter 45 used in the known BS tuner 42 and it is difficult to tune the variable band-pass filter 45 to the high-end frequency.

SUMMARY OF THE INVENTION

In view of the above-described problems, an object of the present invention is to provide a satellite broadcasting receiving tuner having a band-pass filter capable of adequately removing disturbing wave components having frequencies in the vicinity of 480 MHz.

Another object of the present invention is to provide a satellite broadcasting receiving tuner having a band-pass filter capable of being easily tuned to a high-end frequency.

To achieve these objects, according to one aspect of the present invention, there is provided a satellite broadcasting receiving tuner comprising a band-pass filter for transmitting a down-converted received satellite broadcasting signal, and a frequency converter section for converting the received satellite broadcasting signal transmitted through the band-pass filter into an intermediate frequency, wherein the band-pass filter has two variable tuning circuits connected in series and a trap element connected to a point of connection of the two variable tuning circuits to effect selective attenuation at the intermediate frequency.

In this satellite broadcasting receiving tuner, according to another aspect of the present invention, each of the two variable tuning circuits has first and second strip lines connected in series and a voltage-controlled variable capacitance diode branching off from a point of connection of the first and second strip lines, a tuning voltage being supplied to the variable capacitance diode through one of the first and second strip lines.

The band-pass filter used in the above-described satellite broadcasting receiving tuner is formed by two variable tuning circuits connected in series and a trap element connected between a point of connection of the two variable tuning circuits and a ground point to effect selective attenuation at the intermediate frequency of the satellite broadcasting receiving tuner. A disturbing wave component such as waves having a frequency of 480 MHz in a signal supplied to the band-pass filter is adequately attenuated by the trap element. Such a disturbing wave component is thereby inhibited from being transmitted to a subsequent circuit through the band-pass filter.

In the satellite broadcasting receiving tuner according to the first aspect of the present invention, even if a television broadcasting wave (disturbing wave) in the UHF band having a frequency in the vicinity of 480 MHz is mixed in the BS signal input to the BS tuner, it is adequately attenuated in the band-pass filter of the BS tuner. As a result, substantially no such disturbing component is output from the BS tuner.

According to the second aspect of the invention, the tuning control voltage to be applied to the variable capacitance diode is supplied through the first or second strip line. Therefore, the problem of stray capacitance Cs of a buffer resistor connected in parallel with the variable capacitance diode can be avoided and the tuned frequency can easily be adjusted to the high-end frequency when the variable band-pass filter is tuned to the high-end frequency.

DESCRIPTION OF THE PREFERRED EMBODIMENT

A preferred embodiment of the present invention will be described below with reference to the accompanying drawings.

Figure 1:
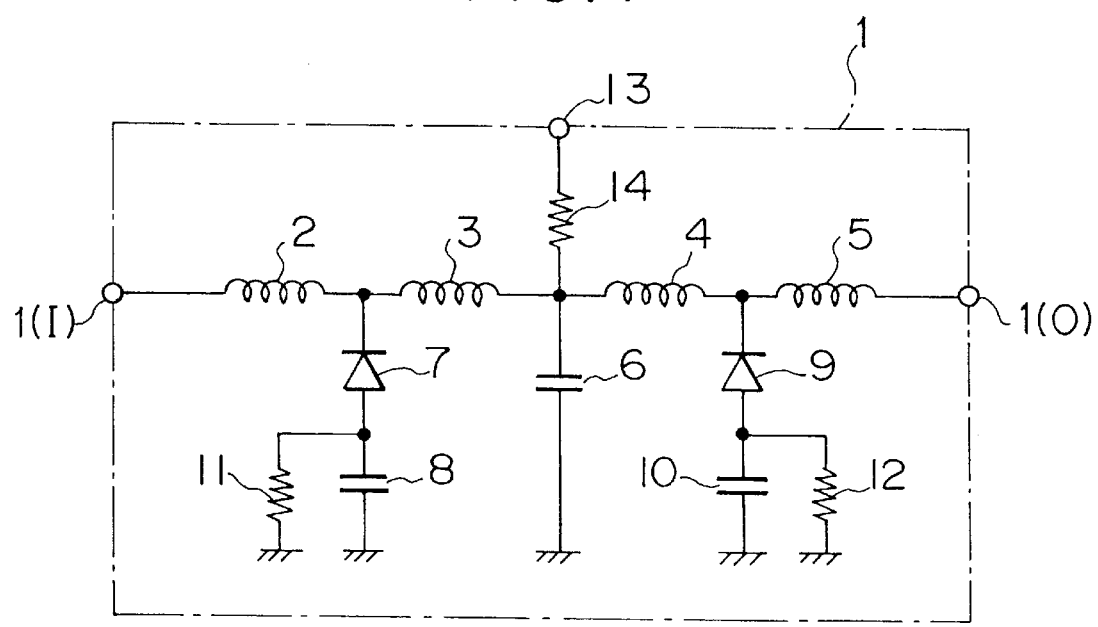
FIG. 1 is a circuit diagram of an example of a band-pass filter for use in a satellite broadcasting receiving tuner in accordance with the present invention.

FIG. 1 shows the circuit configuration of a variable band-pass filter 1 arranged for use in a satellite broadcasting receiving tuner in accordance with the present invention.

As shown in FIG. 1, the variable band-pass filter 1 has a first strip line (first inductor) 2, a second strip line (second inductor) 3, a third strip line (third inductor) 4 and a fourth strip line (fourth inductor) 5 connected in series between an input terminal 1(I) and an output terminal 1(O). A chip capacitor (trap element) 6 is connected as a branch line between a point of connection of the second and third strip lines 3 and 4 and a ground point.

A first variable capacitance diode 7 and a first capacitor 8 are connected in series between a point of connection of the first and second strip lines 2 and 3 and a ground point. A second variable capacitance diode 9 and a second capacitor 10 are connected in series between a point of connection of the third and fourth strip lines 4 and 5 and a ground point. A first resistor 11 is connected between a point of connection of the first variable capacitance diode 7 and the first capacitor 8 and a ground point. A second resistor 12 is connected between a point of connection of the second variable capacitance diode 9 and the second capacitor 10 and a ground point. A buffer resistor 14 is connected between a tuning control voltage supply terminal 13 and the point of connection of the second and third strip lines 3 and 4. In this embodiment, the chip capacitor 6 has a self resonance frequency in the vicinity of 480 MHz and has such a trap characteristic that the impedance value decreases abruptly in the vicinity of the frequency of 480 MHz. A first variable tuning circuit is formed by the first and second strip lines 2 and 3, the first variable capacitance diode 7 and the first capacitor 8 while a second variable tuning circuit is formed by the third and fourth strip lines 4 and 5, the second variable capacitance diode 9 and the second capacitor 10.

The thus-arranged variable band-pass filter 1 in accordance with the present invention operates as described below.

When a tuning control voltage which is changed according to changes in the local oscillation frequency of a local oscillation section (not shown in FIG. 1) is applied to the tuning control voltage supply terminal 13, it is supplied to the first variable capacitance diode 7 through the second strip line 3 and to the second variable capacitance diode 9 through the third strip line 4 to respectively change the capacitances of the first and second variable capacity diodes 7 and 9. The band-pass frequency of the variable band-pass filter 1 is thereby tuned to a predetermined frequency in the range from 1 to 2 GHz (1000 to 2000 MHz), i.e., the frequency of an input BS signal. When the BS signal supplied to the input terminal 1(I) is transmitted through the variable band-pass filter 1 tuned to the desired frequency, unnecessary signal components of the BS signal is removed. The BS signal is thereafter supplied to a subsequent mixer section (not shown in FIG. 1) through the output terminal 1(O).

Figure 2:
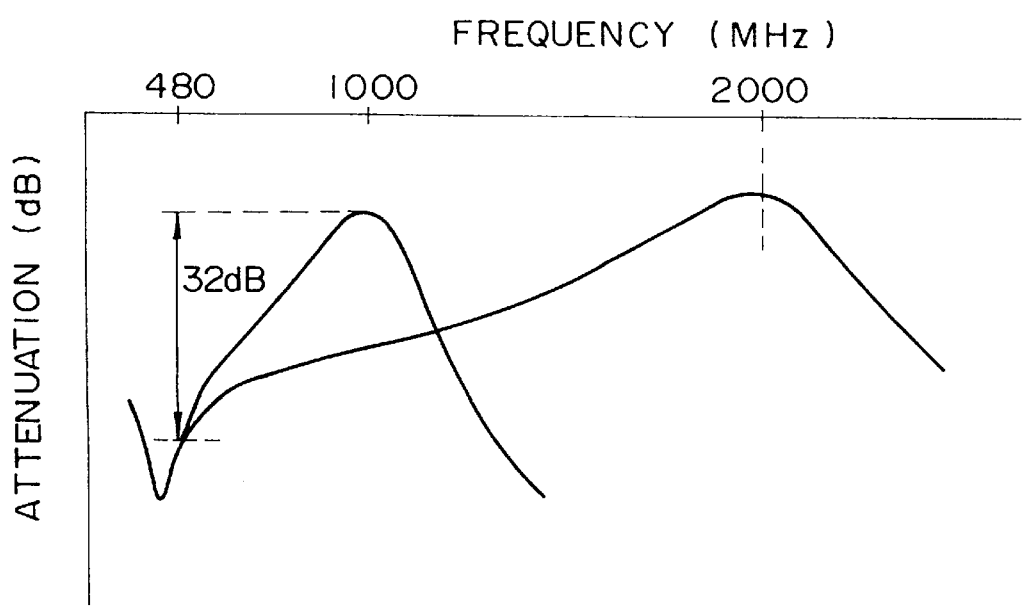
FIG. 2 is a diagram showing an example of frequency-transmission characteristics of the band-pass filter shown in FIG. 1.
Figure 3:
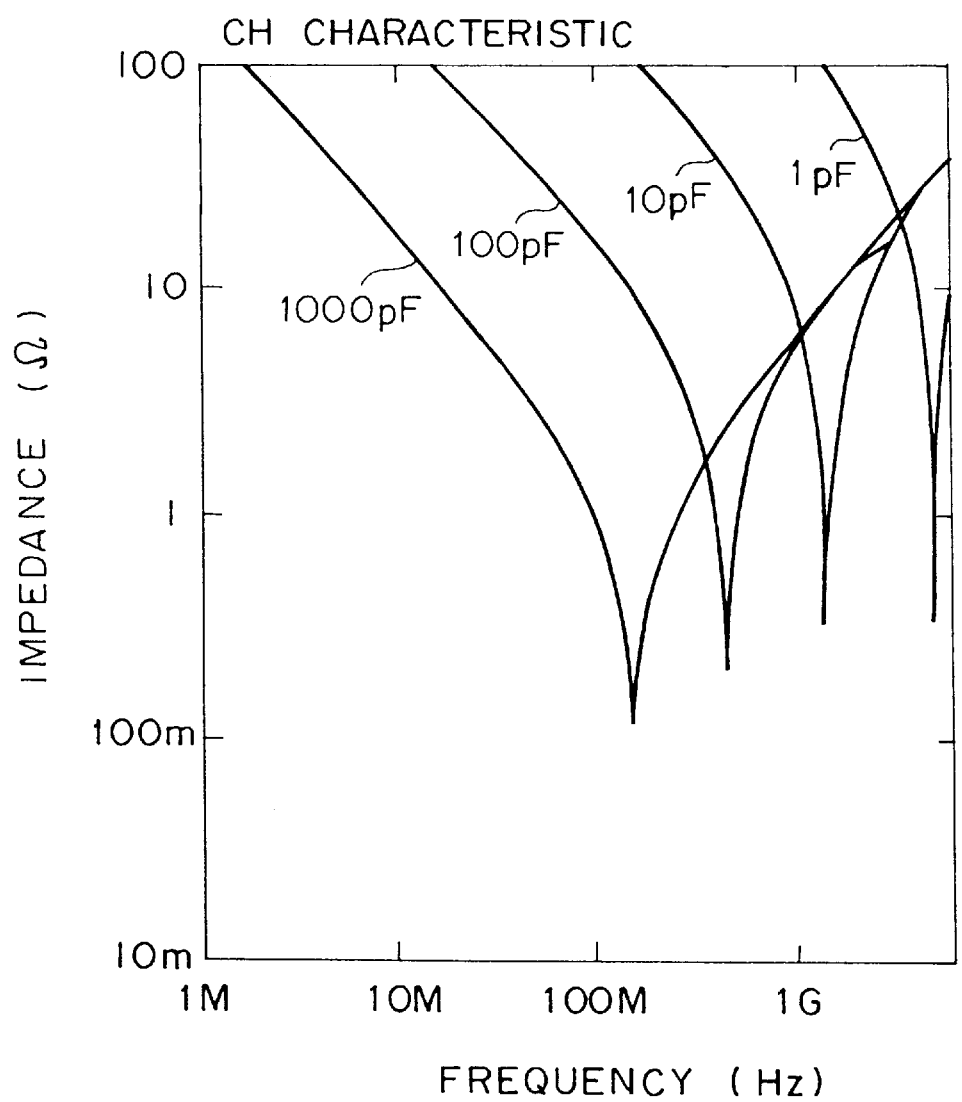
FIG. 3 is a diagram showing an example of frequency-impedance characteristics of a chip capacitor used in the band-pass filter shown in FIG. 1.
Figure 4:
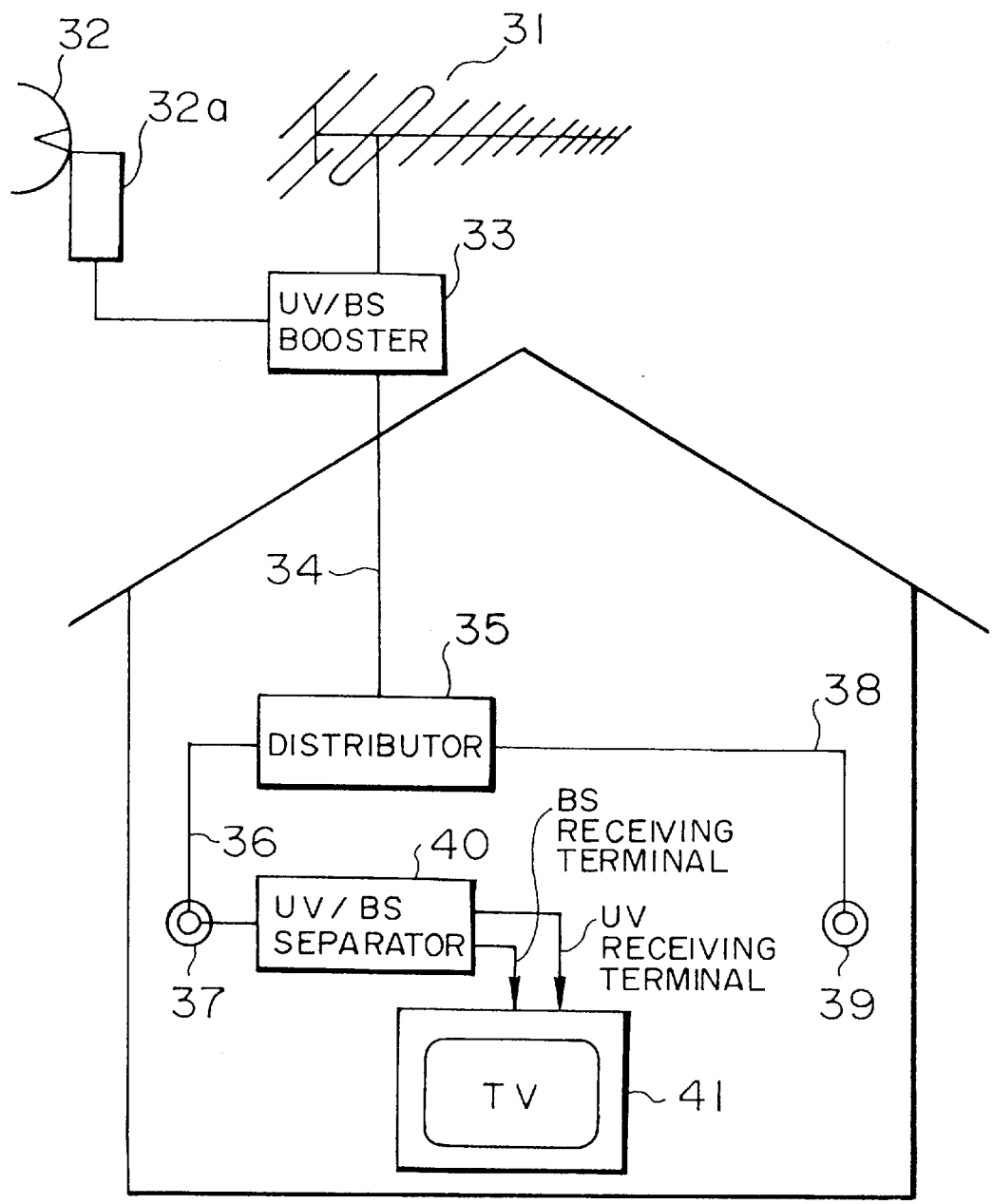
FIG. 4 is a schematic diagram of a known signal receiving system in which electric waves of ground wave broadcasting in the VHF and UHF bands and satellite broadcasting are received with an antenna and input to a television set.
Figure 5:
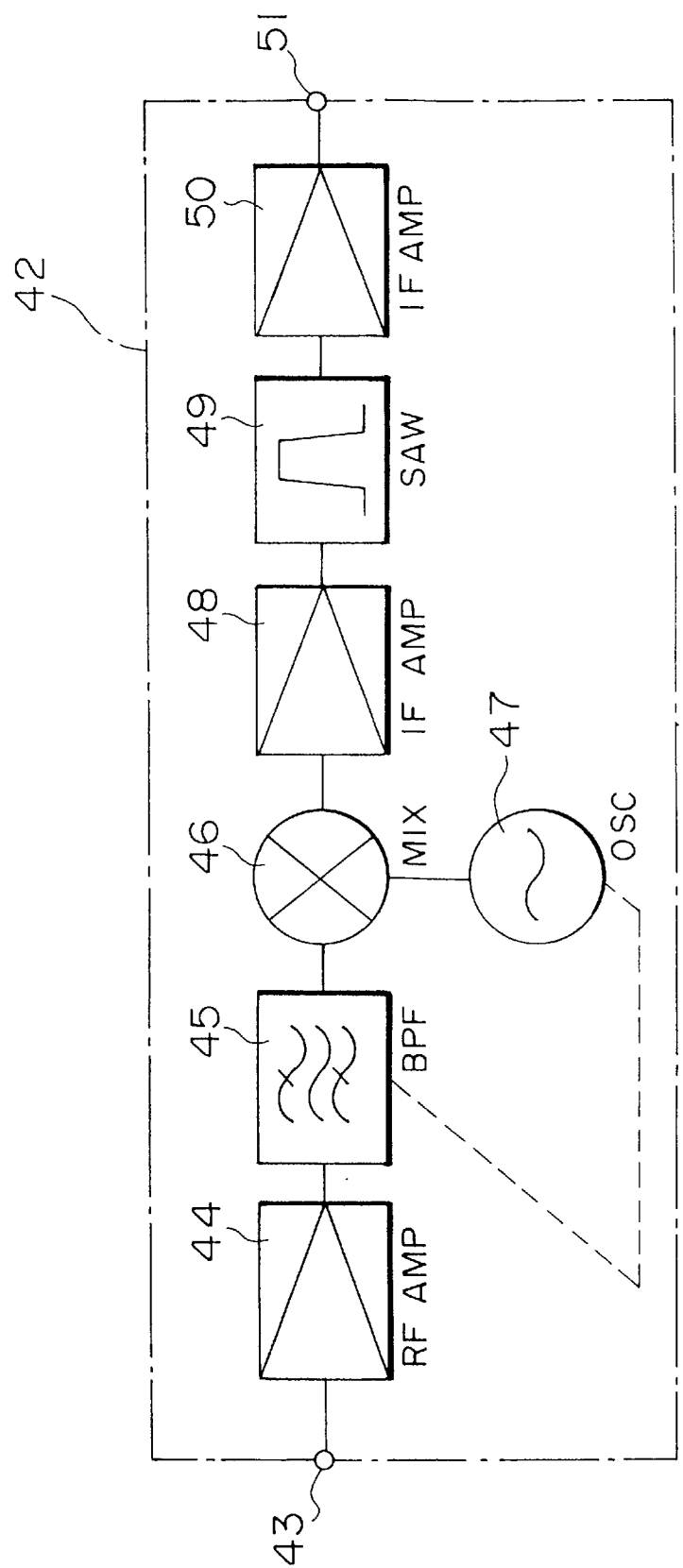
FIG. 5 is a block diagram of a known BS tuner.
Figure 6A:
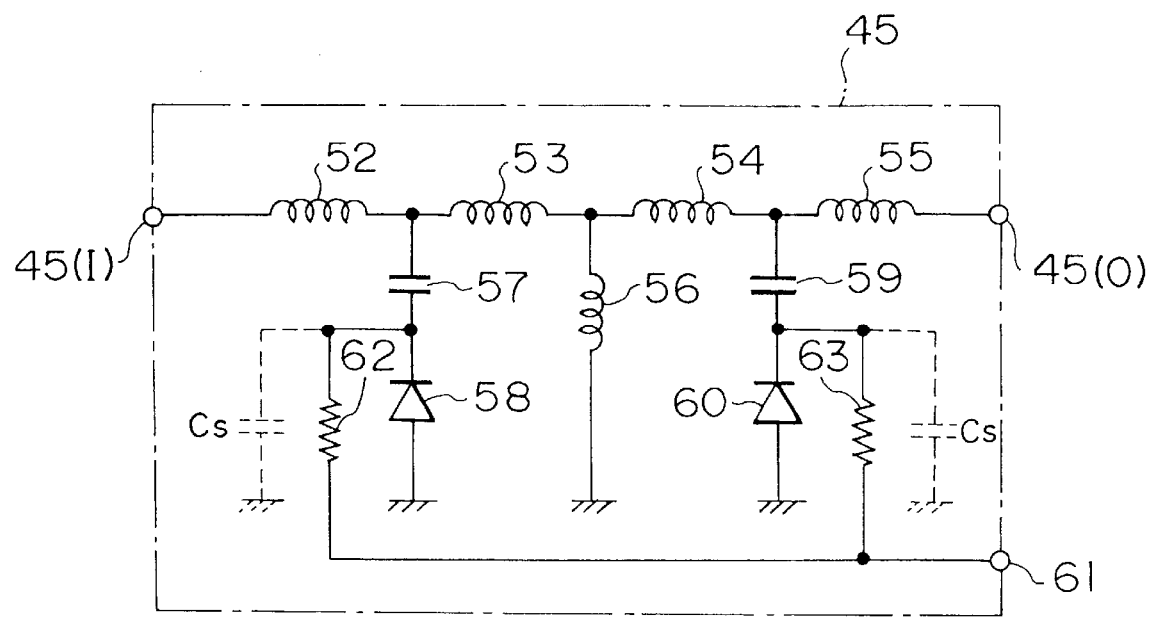
FIG. 6A is a circuit diagram of an example of a variable band-pass filter used in the known BS tuner.
Figure 6B:
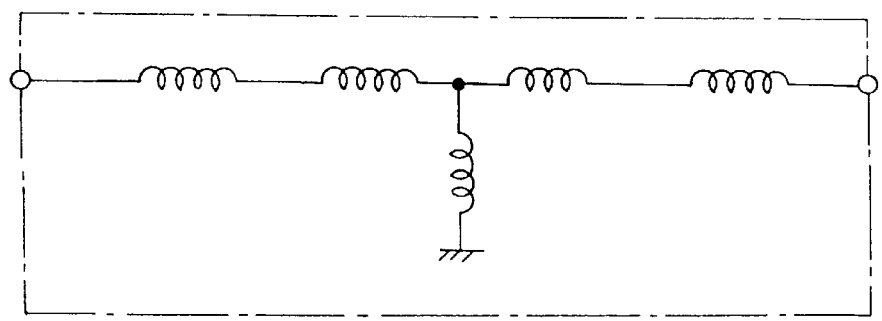
FIG. 6B is an equivalent circuit diagram of the variable band-pass filter shown in FIG. 6A.

FIG. 2 is a diagram showing an example of frequency-transmission characteristics of the variable band-pass filter 1 in the above-described embodiment of the present invention, and FIG. 3 is a diagram showing an example of frequency-impedance characteristics of the chip capacitor 6 used in the variable band-pass filter 1.

Figure 7:
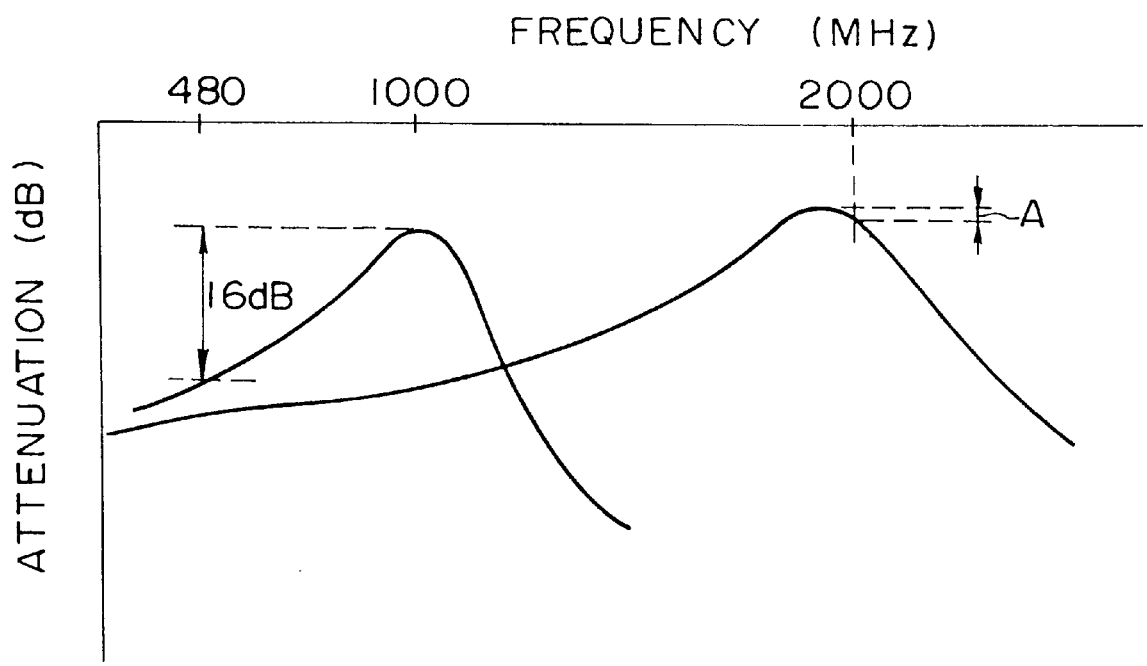
FIG. 7 is a diagram showing an example of frequency-transmission characteristics of the known variable band-pass filter.

As shown in FIG. 3, if the capacitance of chip capacitor 6 selected for use in the variable band-pass filter 1 is 100 pF, the chip capacitor 6 has a self-resonance frequency in the vicinity of 480 MHz and exhibits such a characteristic that the impedance value decreases abruptly in the vicinity of 480 MHz. The variable band-pass filter 1 using such chip capacitor 6 has such frequency characteristics as to have an attenuation of about 32 db at a frequency in the vicinity of 480 MHz when tuned to 1 GHz and also to have an attenuation of about 32 db at a frequency in the vicinity of 480 MHz when tuned to 2 GHz. Thus, the variable band-pass filter 1 can have an attenuation approximately twice the attenuation of about 16 db at a frequency in the vicinity of 480 MHz in the characteristics of the conventional variable band-pass filter 45 shown in FIG. 7.

In the variable band-pass filter 1 of the embodiment of the present invention, since there is a need to reduce the impedance at the point of connection between the two variable tuning sections of the complex tuning circuit at the time of tuning, it is preferable to connect the chip capacitor 6 between the point of connection of the two variable tuning sections and a reference potential point. Even if the chip capacitor 6 is connected to the point of connection of the two variable tuning sections, it does not influence the tuning characteristics of the complex tuning circuit formed of the two variable tuning sections.

As described above, the variable band-pass filter 1 of the embodiment of the present invention can adequately attenuate television broadcasting waves (disturbing waves) in the UHF band contained in the BS signal and having frequencies in the vicinity of 480 MHz. Thus, a disturbing wave having a frequency in the vicinity of 480 MHz can be prevented from being output at a comparatively large amplitude from the variable band-pass filter 1. Also, a disturbing wave having a frequency in the vicinity of 480 MHz can be prevented from being output at a comparatively large amplitude from the BS tuner.

The variable band-pass filter 1 of the embodiment of the present invention is arranged so as to apply the tuning control voltage to the first and second variable capacitance diodes 7 and 9 through the second and third strip lines 3 and 4, thereby avoiding parallel connection of stray capacitances to the first and second variable capacitance diodes 7 and 9. Therefore, when the variable band-pass filter 1 is tuned to the high-end frequency, the tuned frequency can be adjusted to the high-end frequency more easily.

In the above-described embodiment, the tuning control voltage to be applied to the first and second variable capacitance diodes 7 and 9 are supplied through the second and third strip lines 3 and 4. However, this method of supplying the tuning control voltage to the first and second variable capacitance diodes 7 and 9 is not exclusively used. According to the present invention, the arrangement may alternatively be such that the first and second variable capacitance diodes 7 and 9 are supplied with the tuning control voltage separately through the first and fourth strip lines 2 and 5, respectively.

With respect to the above-described embodiment, an example of the variable band-pass filter 1 using the first to fourth strip lines 2 to 5 has been described. The variable band-pass filter 1 of the present invention, however, is not limited to the example using the first to fourth strip lines 2 to 5. Other kinds of elements, for example, first to fourth high-frequency coils may be used instead of the strip lines.

According to the present invention, as described above in detail, the chip capacitor (trap element) 6 is connected to make it is possible to adequately attenuate television broadcasting waves (disturbing waves) in the UHF band contained in the BS signal and having frequencies in the vicinity of 480 MHz. As a result, a disturbing wave having a frequency in the vicinity of 480 MHz can be prevented from being output at a comparatively large amplitude from the variable band-pass filter 1, and a disturbing wave having a frequency in the vicinity of 480 MHz can also be prevented from being output at a comparatively large amplitude from the BS tuner.

Also, according to the present invention, the method of applying the tuning control voltage to the tuning frequency control elements (first and second variable capacitance diodes) 7 and 9 through the serial conductive elements (second and third strip lines) 3 and 4 is used to avoid parallel connection of stray capacitances to the tuning frequency control elements (first and second variable capacitance diodes) 7 and 9. Therefore, when the variable band-pass filter 1 is tuned to the high-end frequency, the tuned frequency can be adjusted to the high-end frequency more easily.

What is claimed is:

1. A satellite broadcasting system receiving tuner comprising:

a band-pass filter for transmitting a down-converted received satellite broadcasting signal; and a frequency converter section for converting said received satellite broadcasting signal transmitted through said band-pass filter into an intermediate frequency, wherein said band-pass filter has two variable tuning circuits connected in series and a trap element consists of a chip capacitor connected to a point of connection of said two variable tuning circuits, the chip capacitor effecting selective attenuation at said intermediate frequency and wherein the frequency of said trap capacitor is equal to a self resonance frequency of the chip capacitor.

2. A satellite broadcasting receiving tuner according to claim 1, wherein said two variable tuning circuits form a variable-frequency band-pass filter including a voltage-controlled variable capacitance diode.

3. A satellite broadcasting receiving tuner according to claim 2, wherein each of said two variable tuning circuits has first and second strip lines connected in series and a voltage-controlled variable capacitance diode connected as a branch line between a point of connection of said first and second strip lines and a ground point.

4. A satellite broadcasting receiving tuner according to claim 1, wherein each of said two variable tuning circuits has first and second strip lines connected in series and a voltage-controlled variable capacitance diode connected as a branch line between a point of connection of said first and second strip lines and a ground point.

* * * * *